(12) United States Patent
Hung et al.

(10) Patent No.: US 12,272,397 B2
(45) Date of Patent: Apr. 8, 2025

(54) FORMING OPERATION METHOD OF RESISTIVE RANDOM ACCESS MEMORY

(71) Applicant: United Microelectronics Corp., Hsinchu (TW)

(72) Inventors: Yi Ting Hung, Kaohsiung (TW); Ko-Chi Chen, Hsinchu (TW); Tzu-Yun Chang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 137 days.

(21) Appl. No.: 18/180,864

(22) Filed: Mar. 9, 2023

(65) Prior Publication Data

US 2024/0282371 A1 Aug. 22, 2024

(30) Foreign Application Priority Data

Feb. 17, 2023 (TW) .................................. 112105780

(51) Int. Cl.
*G11C 11/00* (2006.01)
*G11C 13/00* (2006.01)

(52) U.S. Cl.
CPC ...... *G11C 13/0026* (2013.01); *G11C 13/0028* (2013.01); *G11C 13/0038* (2013.01); *G11C 13/004* (2013.01); *G11C 2013/0045* (2013.01)

(58) Field of Classification Search
CPC ............ G11C 13/0026; G11C 13/0028; G11C 13/0038; G11C 13/004; G11C 2013/0045; G11C 2013/0078; G11C 2013/0083; G11C 2013/0092; G11C 13/0069
USPC .......................................................... 365/148
See application file for complete search history.

(56) References Cited

U.S. PATENT DOCUMENTS

| | | | |
|---|---|---|---|
| 8,482,972 B2 * | 7/2013 | Chung ................... | H10B 61/10 365/175 |
| 9,053,781 B2 | 6/2015 | Tsai et al. | |
| 9,165,933 B2 * | 10/2015 | Rabkin ................. | H10B 63/34 |
| 9,178,144 B1 | 11/2015 | Sung et al. | |
| 10,163,503 B2 | 12/2018 | Lee et al. | |

* cited by examiner

*Primary Examiner* — Tha-O H Bui
(74) *Attorney, Agent, or Firm* — JCIPRNET

(57) ABSTRACT

A forming operation method of a resistive random access memory is provided. The method includes the following steps. A positive pulse and a negative pulse are sequentially applied, by a bit line/source line driver, to multiple resistive random access memory cells in a direction form a farthest location to a nearest location based on the bit line/source line driver through a bit line and a source line to break down a dielectric film of each of the resistive random access memory cells and generate a conductive filament of each of the resistive random access memory cells.

14 Claims, 5 Drawing Sheets

FORMING OPERATION METHOD OF RESISTIVE RANDOM ACCESS MEMORY

CROSS-REFERENCE TO RELATED APPLICATION

This application claims the priority benefit of Taiwan application serial no. 112105780, filed on Feb. 17, 2023. The entirety of the above-mentioned patent application is hereby incorporated by reference herein and made a part of this specification.

BACKGROUND

Technical Field

The disclosure relates to a forming operation method, and in particular relates to a forming operation method of a resistive random access memory.

Description of Related Art

With the vigorous development of semiconductor technology, next-generation non-volatile memory technologies include emerging technologies such as the ferroelectric random access memory (FRAM), the phase-change random access memory (PRAM), the magnetoresistive random access memory (MRAM), and the resistive random access memory (RRAM) are approaching maturity, wherein the next-generation non-volatile memory not only has a fast read and write speed, but also can operate under extremely low current, so as to be qualified to replace the NAND flash memory.

In the next-generation non-volatile memory, the resistive random access memory needs to perform a pulse forming operation to form a conductive filament in a resistive element of the resistive random access memory. Furthermore, the resistive element of the resistive random access memory is basically composed of an upper electrode, a lower electrode, and a layer of dielectric material in the middle, and the resistance value of the resistive element may be changed by applying an electric field to store data. Before performing a write operation, a positive pulse and a negative pulse need to be applied to break down the dielectric layer and form the conductive filament. This step is referred to as a forming operation. After forming the conductive filament, the resistance value of the resistance element of the resistive random access memory is reduced from hundreds of millions of ohms to tens of thousands of ohms. Then, set and reset operations may be performed, so that the resistance value of the conductive filament transitions between a low resistance state and a high resistance state.

However, the voltage drop issue may be encountered when forming the conductive filament for the resistive elements of all the random access memories in an array, which reduces the voltage of the forming operation, requires more time to retry and higher operating voltage to form the conductive filament, and may even fail. The voltage drop issue is mainly caused by the two following factors. 1. Due to the parasitic resistance of the conductive wire in the circuit, resistive random access memory cells further away from the bit line/source line driver experience a greater IR drop. 2. Usually, the sequence of the forming operation is sequentially performed from the resistive random access memory cells near the bit line/source line driver to the resistive random access memory cells further from the bit line/source line driver. The resistance values of the resistive elements whose conductive filaments are formed are greatly reduced, and the leakage current of transistors connected in series thereto affects the voltages of the forming operations of the resistive elements of the other resistive random access memory cells. Therefore, how to ensure a smooth forming operation of the resistive random access memory is an important topic.

SUMMARY

The disclosure provides a forming operation method of a resistive random access memory, which can reduce a working voltage of a bit line/source line driver, and quickly form a conductive filament of a resistive random access memory cell, so as to reduce the number of retries.

A forming operation method of a resistive random access memory of the disclosure includes the following steps. A positive pulse and a negative pulse are sequentially applied, by a bit line/source line driver, to multiple resistive random access memory cells in a direction from a farthest location to a nearest location based on the bit line/source line driver through a bit line and a source line to break down a dielectric film of each of the resistive random access memory cells and generate a conductive filament of each of the resistive random access memory cells.

Based on the above, in the forming operation method of the resistive random access memory according to the embodiment of the disclosure, since the resistive random access memory cell at any location will not experience the voltage drop caused by the maximum resistance value of the conductive wire and the maximum leakage current at the same time, the maximum voltage drop experienced by the resistive random access memory cell can be reduced, so that the resistive random access memory cell can form the conductive filament faster, that is, the number of retries can be reduced.

In order for the features and advantages of the disclosure to be more comprehensible, the following specific embodiments are described in detail in conjunction with the drawings.

DETAILED DESCRIPTION OF DISCLOSED EMBODIMENTS

Figure 1A:
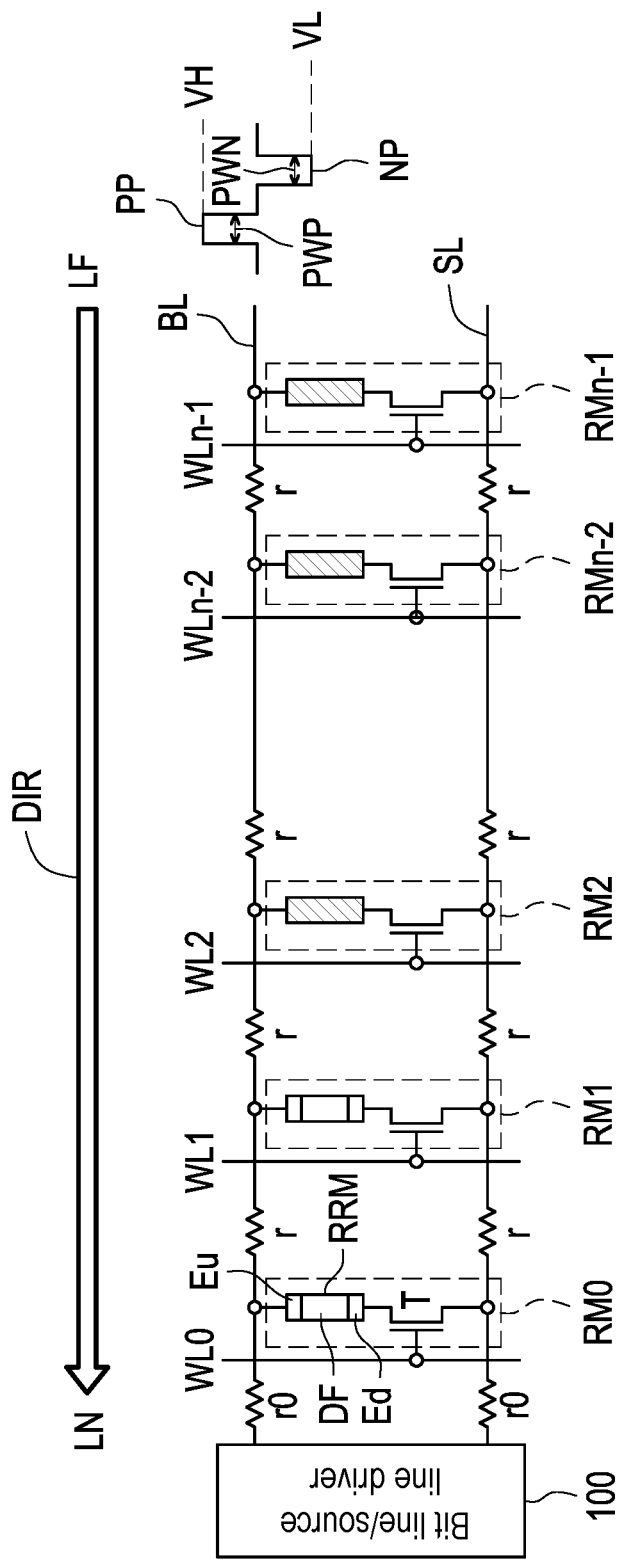
FIG. 1A is a schematic circuit diagram of performing a forming operation by a resistive random access memory cell according to an embodiment of the disclosure.
Figure 1B:
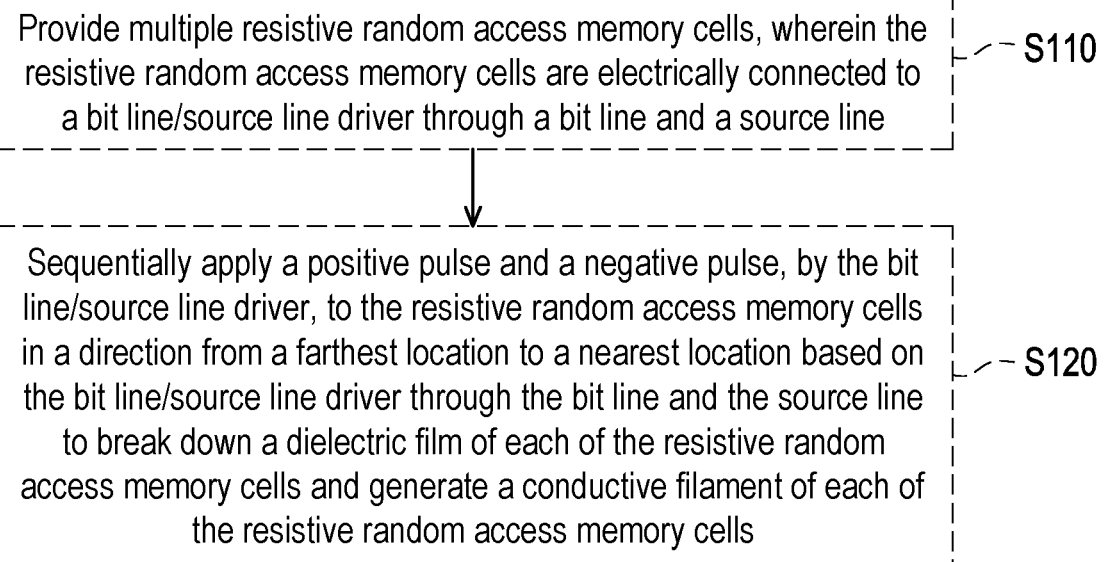
FIG. 1B is a flowchart of a forming operation method of a resistive random access memory cell according to an embodiment of the disclosure.

FIG. 1A is a schematic circuit diagram of performing a forming operation by a resistive random access memory cell according to an embodiment of the disclosure. FIG. 1B is a flowchart of a forming operation method of a resistive random access memory cell according to an embodiment of the disclosure. Please refer to FIG. 1A and FIG. 1B. In an embodiment of the disclosure, the forming operation method of the resistive random access memory cell includes the following steps. In Step S110, multiple resistive random access memory cells RM0 to RMn−1 are provided, wherein the resistive random access memory cells RM0 to RMn−1 are electrically connected to a bit line/source line driver 100 through a bit line BL and a source line SL, and each of the resistive random access memory cells RM0 to RMn−1 includes a resistive element RRM and a transistor T. The resistive random access memory cells RM0 to RMn−1 have a first electrode Eu connected to the bit line BL, a second electrode Ed, and a dielectric film DF located between the first electrode Eu and the second electrode Ed. The transistor T has a first terminal electrically connected to the second electrode Ed, a control terminal electrically connected to one of multiple word lines WL0 to WLn−1, and a second terminal electrically connected to the source line SL.

In Step S120, a positive pulse PP and a negative pulse NP are sequentially applied, by the bit line/source line driver 100, to the resistive random access memory cells RM0 to RMn−1 in a direction DIR from a farthest location LF to a nearest location LN based on the bit line/source line driver 100 through the bit line BL and the source line SL to break down the dielectric film DF of each of the resistive random access memory cells RM0 to RMn−1 and generate a conductive filament of each of the resistive random access memory cells RM0 to RMn−1.

Figure 1C:
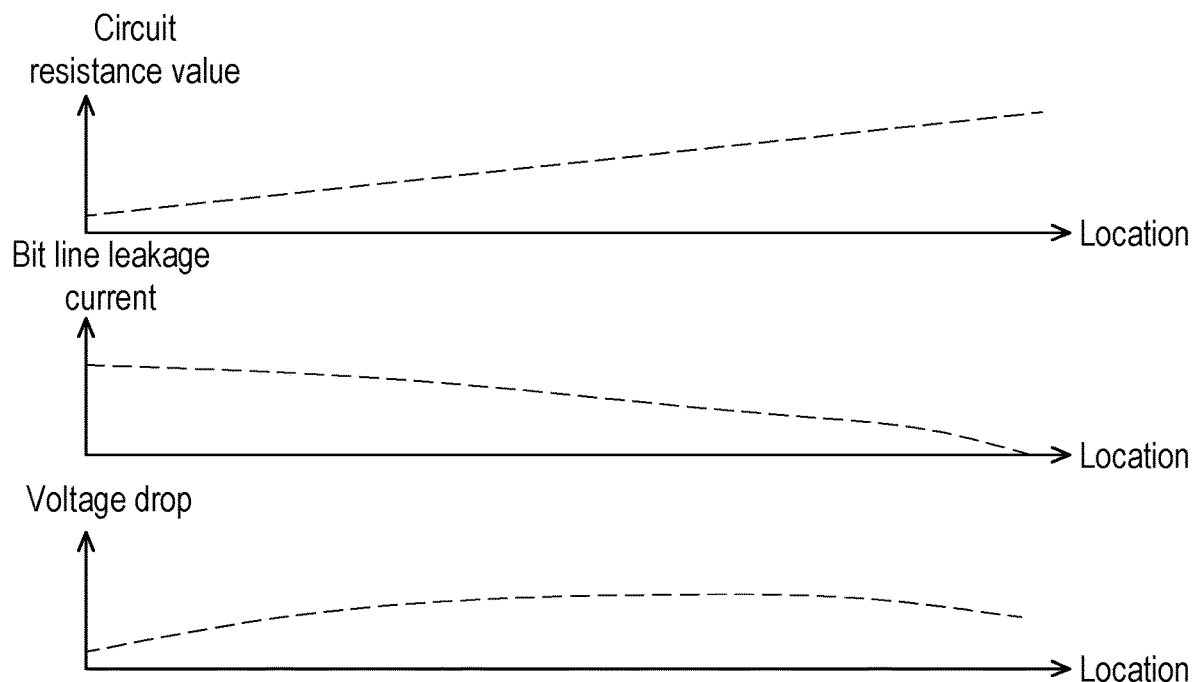
FIG. 1C is a schematic diagram of relationships between circuit resistance, bit line leakage current, and voltage drop and location according to an embodiment of the disclosure.
Figure 1D:
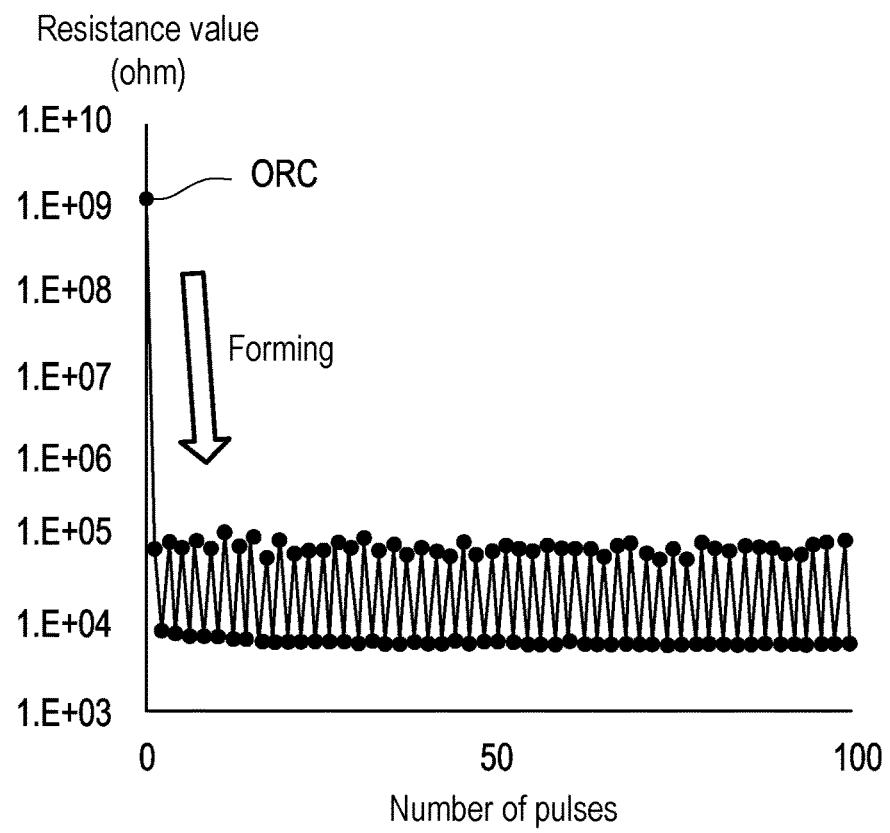
FIG. 1D is a schematic diagram of a resistance relationship of performing forming by a resistive random access memory cell according to an embodiment of the disclosure.

FIG. 1C is a schematic diagram of relationships between circuit resistance, bit line leakage current, and voltage drop and location according to an embodiment of the disclosure. FIG. 1D is a schematic diagram of a resistance relationship of performing forming by a resistive random access memory cell according to an embodiment of the disclosure. As shown in FIG. 1A and FIG. 1C, the bit line BL and the source line SL may be regarded as multiple circuit resistors r0 and r connected in series. Therefore, when the positive pulse PP and the negative pulse NP are provided to the distant resistive random access memory cell (for example, RMn−1) (that is, closer to the farthest location LF) to form the conductive filament, since the length of the conductive wire connecting the bit line/source line driver 100 to the distant resistive random access memory cell (for example, RMn−1) is longer, the working voltage generates an IR drop due to the greater parasitic resistance (for example, the sum of the resistance of the circuit resistors r0 and r) of the circuit. Moreover, when the forming operation is changed to be sequentially performed from the most distant resistive random access memory cell (for example, RMn−1) (that is, at the farthest location LF) to the proximity (that is, closer to the nearest location LN), since the resistive random access memory cells (for example, RM0 to RMn−1) have higher resistance values ORC (for example, 1E+09) before forming the conductive filaments that are much greater than the resistance values (for example, 1E+04 to 1E+05) after formation, when the resistive random access memory cells (for example, RM0 to RMn−1) perform the forming operations, the leakage current of the resistive random access memory cells (for example, RM0 to RMn−1) not formed with the conductive filaments is lower than the leakage current of the resistive random access memory cells (for example, RM0 to RMn−1) formed with the conductive filaments, which reduces the voltage drop caused by the proximal resistive random access memory cells (for example, RM0 to RMn−1), so that the most distant resistive random access memory cell (for example, RMn−1) (that is, at the farthest location LF) does not experience the maximum parasitic IR drop of the conductive wire and the voltage drop caused by the maximum leakage current at the same time. Therefore, the maximum voltage drop of a resistive random access memory array (of, for example, the resistive random access memory cells RM0 to RMn−1) can be reduced.

According to the above, the main advantages of the disclosure are as follows. 1) Since the most distant resistive random access memory cell (for example, RMn−1) will not experience the maximum parasitic IR drop of the conductive wire and the voltage drop caused by the maximum leakage current at the same time, so that the overall voltage drop experienced by the resistive random access memory cells (for example, RM0 to RMn−1) is lower, the working voltage of the bit line/source line driver 100 can be reduced. 2) Since the overall voltage drop experienced by the resistive random access memory cells (for example, RM0 to RMn−1) is lower, the resistive random access memory cells (for example, RM0 to RMn−1) can form the conductive filaments faster, that is, the number of retries can be reduced. 3) Since the overall voltage drop experienced by the resistive random access memory cells (for example, RM0 to RMn−1) is lower, the maximum voltage for performing the forming operations by the resistive random access memory cells (for example, RM0 to RMn−1) can be reduced, that is, sufficient voltage can be provided with fewer high voltage elements. 4) Due to the reduction of the high voltage elements, a single decoder in the bit line/source line driver 100 may be connected to more resistive random access memory cells (for example, RM0 to RMn−1), so the area of the decoder can be reduced, that is, the area efficiency can be improved. 5) Since the overall voltage drop experienced by the resistive random access memory cells (for example, RM0 to RMn−1) is lower, the change amplitude of the actual driving voltage (that is, a high forming voltage VH of the positive pulse PP and a low forming voltage VL of the negative pulse NP) is reduced, which can improve the uniformity of the resistive random access memory cells (for example, RM0 to RMn−1). 6) Since the overall voltage drop experienced by the resistive random access memory cells (for example, RM0 to RMn−1) is lower, the forming voltages of the resistive random access memory cells (for example, RM0 to RMn−1) are sufficient, and the conductive filaments formed in the resistive random access memory cells (for example, RM0 to RMn−1) have better quality, so the reliability of the resistive random access memory cells (for example, RM0 to RMn−1) can be improved.

TABLE 1

| | Word line | | | | | |
|---|---|---|---|---|---|---|
| | 0-127<br>Group 1 | 128-383<br>Group 2 | 384-767<br>Group 3 | 768-1279<br>Group 4 | 1280-1791<br>Group 5 | 1792-2047<br>Group 6 |
| Initial value | +0 V | +Δ V | +2Δ V | +2Δ V | +2Δ V | +Δ V |

In an embodiment of the disclosure, the low forming voltage VL of the negative pulse NP may be fixed, and an initial value of the high forming voltage VH of the positive pulse PP may change along with the location of each of the resistive random access memory cells RM0 to RMn−1. In an embodiment of the disclosure, the low forming voltage VL may be between 1.6 and 3 volts, and the initial value of the high forming voltage VH may be between 2.6 and 4 volts. As shown in Table 1, taking 2048 word lines as an example, the resistive random access memory cells (for example, RM0 to RMn−1) are divided into 6 groups, wherein Groups 3 to 5 have the highest addition of +2ΔV, that is, Group 4 located at the middle location (that is, the 1024th bit line) between the farthest location LF and the nearest location LN and adjacent Groups 3 and 5 have the highest initial values, while Group 1 (that is, the 1st to 127th bit lines) located at the nearest location LN has the lowest initial value (that is, no addition), wherein the highest initial value and the lowest initial value are both between 2.6 and 4 volts, and the highest initial value is greater than the lowest initial value.

In an embodiment of the disclosure, a pulse width PWN of the negative pulse NP is fixed, and a pulse width PWP of the positive pulse PP may change in different forming cycles of each of the resistive random access memory cells RM0 to RMn−1. For example, the pulse width PWP of the positive pulse PP may increase along with the increase in the forming cycles executed on each of the resistive random access memory cells (for example, RM0 to RMn−1).

Figure 2:
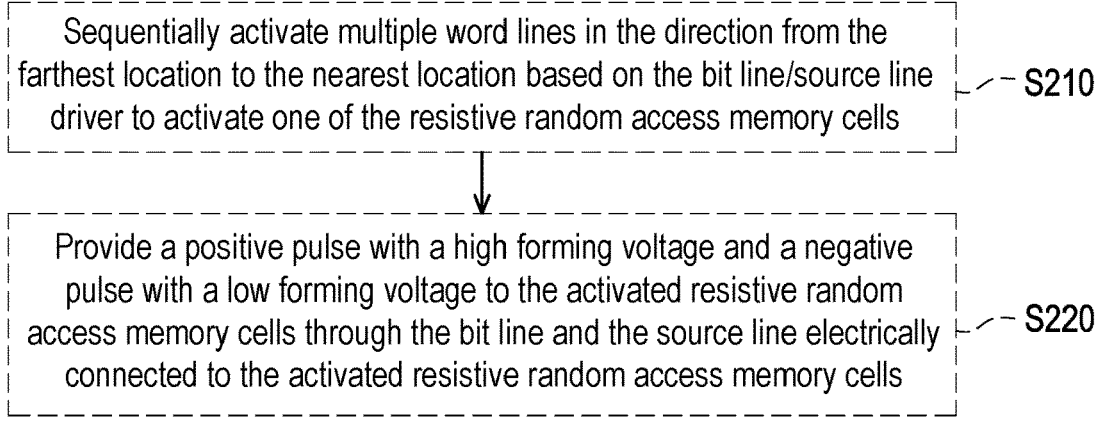
FIG. 2 is a flowchart of applying pulses to a resistive random access memory cell according to an embodiment of the disclosure.

FIG. 2 is a flowchart of applying pulses to a resistive random access memory cell according to an embodiment of the disclosure. Please refer to FIG. 1A, FIG. 1B and FIG. 2. In the embodiment, the action of applying the positive pulse PP and the negative pulse NP may further include Steps S210 and S220. In Step S210, multiple word lines WL0 to WLn−1 are sequentially activated (or enabled) in the direction DIR from the farthest location LF to the nearest location LN based on the bit line/source line driver 100 to activate (or turn on) one of the resistive random access memory cells RM0 to RMn−1.

In Step S220, through the bit line BL and the source line SL electrically connected to the activated resistive random access memory cells RM0 to RMn−1, the positive pulse PP with the high forming voltage VH and the negative pulse NP with the low forming voltage VL are provided to the activated resistive random access memory cells RM0 to RMn−1.

Figure 3:
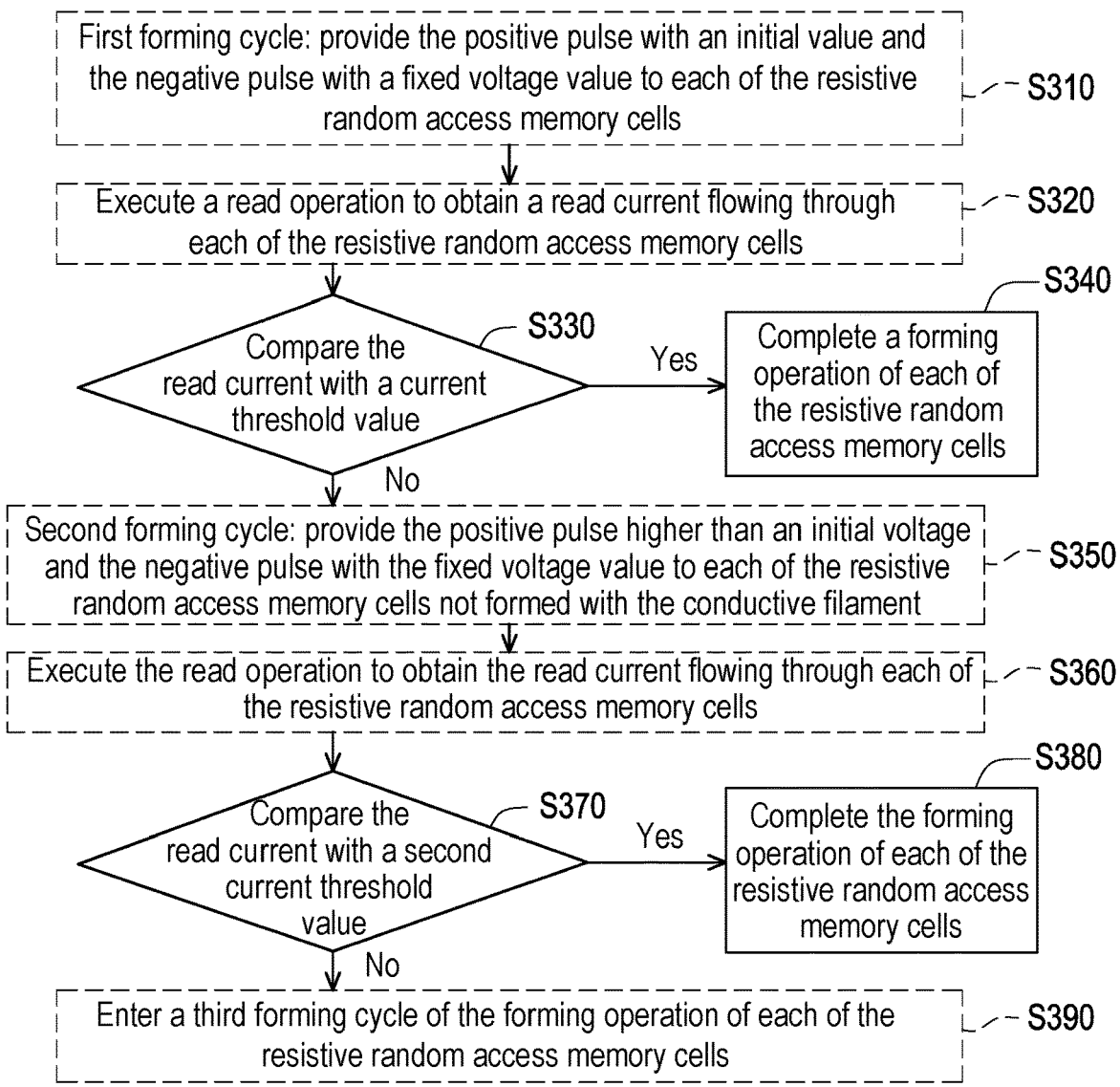
FIG. 3 is a flowchart of a forming operation of generating a conductive filament of a resistive random access memory cell according to an embodiment of the disclosure.

FIG. 3 is a flowchart of a forming operation of generating a conductive filament of a resistive random access memory cell according to an embodiment of the disclosure. Please refer to FIG. 1A, FIG. 1B, and FIG. 3. In the embodiment, the action of applying the positive pulse PP and the negative pulse NP may further include Steps S310, S320, S330, S340, S350, S360, S370, S380, and S390.

In Step S310, in the first forming cycle of each of the resistive random access memory cells (for example, RM0 to RMn−1), the positive pulse PP with the high forming voltage VH with the initial value and the negative pulse NP with the low forming voltage VL with the fixed voltage value are provided to each of the resistive random access memory cells (for example, RM0 to RMn−1). In Step S320, a read operation is executed to obtain a read current flowing through each of the resistive random access memory cells (for example, RM0 to RMn−1). In Step S330, the read current is compared with a current threshold value to judge whether the conductive filament of each of the resistive random access memory cells (for example, RM0 to RMn−1) is formed.

When the read current is greater than or equal to the current threshold value, it means that the conductive filament of each of the resistive random access memory cells (for example, RM0 to RMn−1) is formed, that is, the judgment result of Step S330 is "Yes". Then, enter Step S340, which means that the forming operation of each of the resistive random access memory cells (for example, RM0 to RMn−1) is completed. When the read current is less than the current threshold value, it means that the conductive filament of each of the resistive random access memory cells (for example, RM0 to RMn−1) is not yet formed, that is, the judgment result of Step S330 is "No". Then, enter Step S350 to enter a second forming cycle of the forming operation of each of the resistive random access memory cells (for example, RM0 to RMn−1). In the second forming cycle of each of the resistive random access memory cells (for example, RM0 to RMn−1), the positive pulse PP with the high forming voltage VH higher than the initial value and the negative pulse NP with the low forming voltage VL with the fixed voltage value are provided to each of the resistive random access memory cells (for example, RM0 to RMn−1) not formed with the conductive filament.

In Step S360, the read operation is executed to obtain the read current flowing through each of the resistive random access memory cells (for example, RM0 to RMn−1). Next, in Step S370, the read current is compared with a second current threshold value to judge whether the conductive filament of each of the resistive random access memory cells (for example, RM0 to RMn−1) is formed, wherein the second current threshold value is greater than the current threshold value.

When the read current is greater than or equal to the second current threshold value, it means that the conductive filament of each of the resistive random access memory cells (for example, RM0 to RMn−1) is formed, that is, the judgment result of Step S370 is "Yes". Then, enter Step S380, which means that the forming operation of each of the resistive random access memory cells (for example, RM0 to RMn−1) is completed. When the read current is less than the second current threshold value, it means that the conductive filament of each of the resistive random access memory cells (for example, RM0 to RMn−1) is not yet formed, that is, the judgment result of Step S380 is "No". Then, enter Step S390 to enter a third forming cycle of the forming operation of each of the resistive random access memory cells (for example, RM0 to RMn−1), wherein for the action of the third forming cycle, reference may be made to the action of the second forming cycle, which will not be repeated here.

Figure 4:
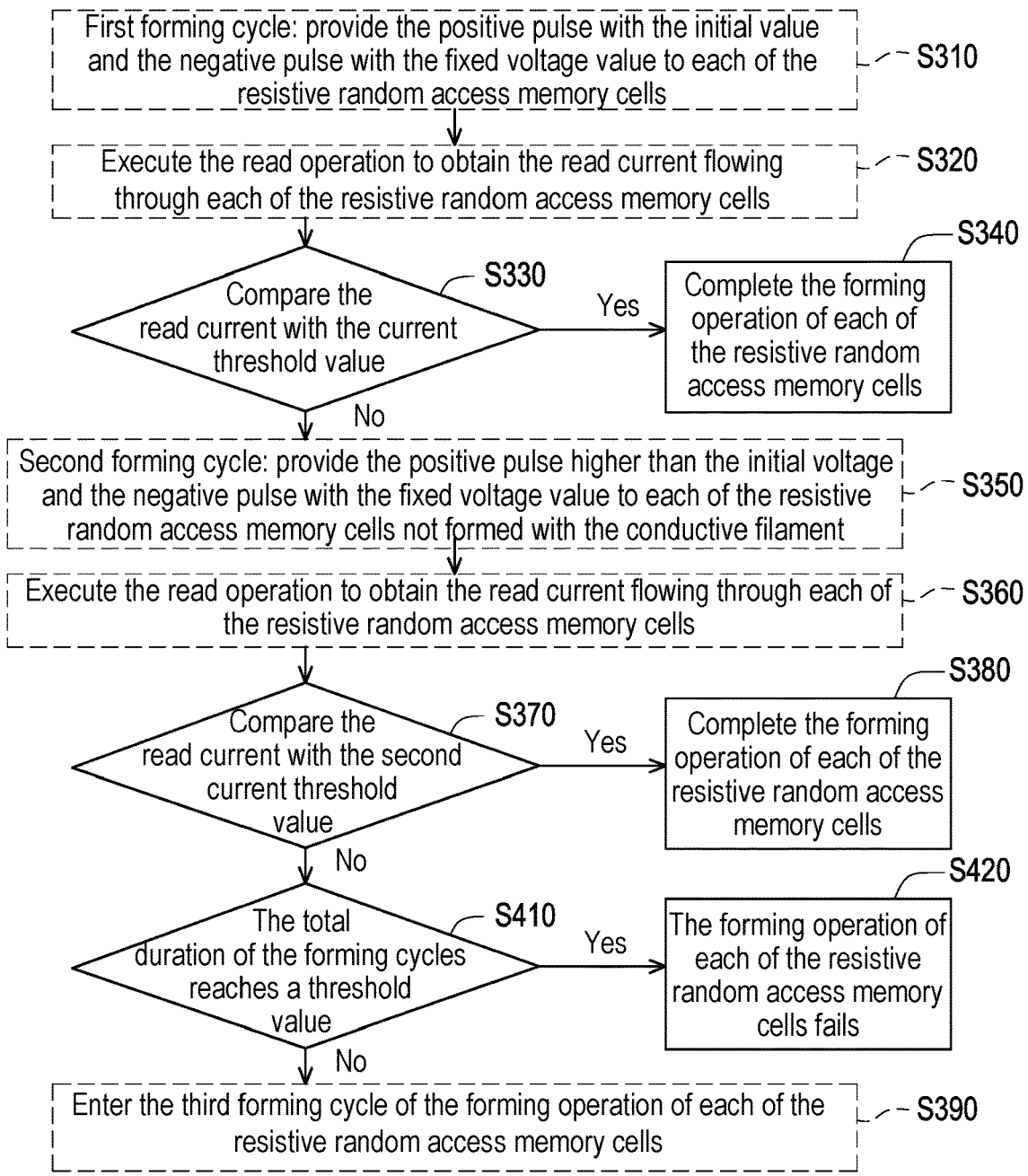
FIG. 4 is a flowchart of a forming operation of a resistive random access memory cell according to another embodiment of the disclosure.

FIG. 4 is a flowchart of a forming operation of a resistive random access memory cell according to another embodiment of the disclosure. Please refer to FIG. 3 and FIG. 4. In the embodiment, the action of applying the positive pulse PP and the negative pulse NP may further include Steps S410 and S420. When the read current is less than the second current threshold value, it means that the conductive filament of each of the resistive random access memory cells (for example, RM0 to RMn−1) is not yet formed, that is, the judgment result of Step S380 is "No". Then, enter Step S410 to judge whether the total duration of the forming cycles performed for each of the resistive random access memory cells (for example RM0 to RMn−1) reaches a threshold value (for example, any value between 0.2 and 1 millisecond).

When the total duration of the forming cycles performed for each of the resistive random access memory cells (for example, RM0 to RMn−1) reaches the threshold value, that is, the judgment result of Step S410 is "Yes", enter Step S420, which means that the forming operation of each of the resistive random access memory cells (RM0 to RMn−1)

fails. When the total duration of the forming cycles performed for each of the resistive random access memory cells (for example, RM0 to RMn−1) does not reach the threshold value, that is, the judgment result of Step S410 is "No", enter Step S390 to enter the third forming cycle of the forming operation of each of the resistive random access memory cells (for example, RM0 to RMn−1), wherein for the action of the third forming cycle, reference may be made to the action of the second forming cycle, which will not be repeated here.

In an embodiment of the disclosure, the total duration of the forming cycles performed for each of the resistive random access memory cells (for example, RM0 to RMn−1) is compared with the threshold value to judge whether the forming operation fails. However, in other embodiments, the number of forming cycles performed for each of the resistive random access memory cells (for example, RM0 to RMn−1) is compared with the threshold value to judge whether the forming operation fails, wherein the threshold value may be between 20 and 120.

Figure 5:
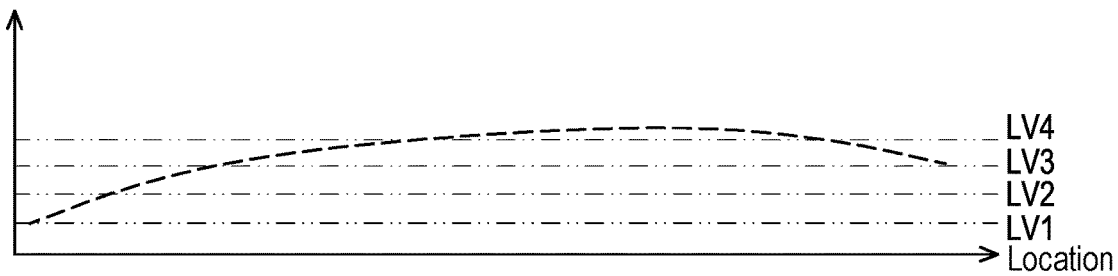
FIG. 5 is a schematic diagram of a relationship between voltage drop and location according to an embodiment of the disclosure.

FIG. 5 is a schematic diagram of a relationship between voltage drop and location according to an embodiment of the disclosure. Please refer to FIG. 1A and FIG. 5. In the embodiment, the low forming voltage VL of the negative pulse NP may be fixed, and the initial value of the high forming voltage VH of the positive pulse PP may change along with a voltage drop distribution of the resistive random access memory cells RM0 to RMn−1. Furthermore, multiple reference levels LV1 to LV4 may be divided on the voltage drop distribution to determine the initial value of the high forming voltage VH of the positive pulse PP of each of the resistive random access memory cells (RM0 to RMn−1) at each location.

In summary, the main advantages of the forming operation method of the resistive random access memory cell according to the embodiment of the disclosure are as follows. 1) Since the overall voltage drop experienced by the resistive random access memory cells is lower, the working voltage of the bit line/source line driver can be reduced. 2) Since the overall voltage drop experienced by the resistive random access memory cells is lower, the resistive random access memory cells can form the conductive filaments faster, that is, the number of retries can be reduced. 3) Since the overall voltage drop experienced by the resistive random access memory cells is lower, the maximum voltage for performing the forming operations by the resistive random access memory cells can be reduced, that is, sufficient voltage can be provided with fewer high voltage elements. 4) Due to the reduction of the high voltage elements, the single decoder in the bit line/source line driver may be connected to more resistive random access memory cells, so the area of the decoder can be reduced, that is, the area efficiency can be improved. 5) Since the overall voltage drop experienced by the resistive random access memory cells is lower, the change amplitude of the actual driving voltage is reduced, which can improve the uniformity of the resistive random access memory cells. 6) Since the overall voltage drop experienced by the resistive random access memory cells is lower, the forming voltages of the resistive random access memory cells are sufficient, and the conductive filaments in the resistive random access memory cells have better quality, so the reliability of the resistive random access memory cells can be improved.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A forming operation method of a resistive random access memory, comprising:
   disposing a plurality of resistive random access memory cells coupled in parallel between a bit line and a source line; and
   sequentially applying a positive pulse and a negative pulse, by a bit line/source line driver coupled to the bit line and the source line, to a plurality of resistive random access memory cells in a direction from a farthest location of the bit line/source line driver to a nearest location of the bit line/source line driver through the bit line and the source line to break down a dielectric film of each of the resistive random access memory cells and generate a conductive filament of each of the resistive random access memory cells.

2. The forming method according to claim 1, wherein applying the positive pulse and the negative pulse comprises:
   sequentially activating a plurality of word lines in the direction to activate one of the resistive random access memory cells;
   providing a positive pulse with a high forming voltage and a negative pulse with a low forming voltage to an activated resistive random access memory cell through the bit line and the source line electrically connected to the activated resistive random access memory cell.

3. The forming operation method according to claim 2, wherein the low forming voltage is fixed, and an initial value of the high forming voltage changes along with a voltage drop distribution of the resistive random access memory cells.

4. The forming operation method according to claim 2, wherein the low forming voltage is fixed, and an initial value of the high forming voltage changes along with a location of each of the resistive random access memory cells.

5. The forming operation method according to claim 4, wherein the low forming voltage is between 1.6 and 3 volts, and the initial value of the high forming voltage is between 2.6 and 4 volts.

6. The forming operation method according to claim 4, wherein the resistive random access memory cells are divided into a plurality of groups, and a resistive random access memory group with a highest initial value is located at a middle location between the farthest location and the nearest location, and
   a resistive random access memory group with a lowest initial value is located at the nearest location.

7. The forming operation method according to claim 6, wherein the highest initial value and the lowest initial value are both between 2.6 and 4 volts.

8. The forming operation method according to claim 4, further comprising:
   providing the positive pulse with the high forming voltage with the initial value in a first forming cycle of each of the resistive random access memory cells;
   executing a read operation to obtain a read current flowing through each of the resistive random access memory cells;
   comparing the read current with a current threshold value to judge whether the conductive filament of each of the resistive random access memory cells is formed;

completing a forming operation of each of the resistive random access memory cells when the conductive filament of each of the resistive random access memory cells is formed; and entering a second forming cycle of the forming operation of each of the resistive random access memory cells when the conductive filament of each of the resistive random access memory cells is not formed.

9. The forming operation method according to claim 8, wherein in the second forming cycle of each of the resistive random access memory cells, the positive pulse has the high forming voltage higher than the initial value.

10. The forming operation method according to claim 8, further comprising:

executing the read operation to obtain the read current flowing through each of the resistive random access memory cells in the second forming cycle of each of the resistive random access memory cells;

comparing the read current with a second current threshold value to judge whether the conductive filament of each of the resistive random access memory cells is formed, wherein the second current threshold value is greater than the current threshold value; and entering a third forming cycle of the forming operation of each of the resistive random access memory cells when the conductive filament of each of the resistive random access memory cells is not formed.

11. The forming operation method according to claim 8, wherein when a total duration of a plurality of forming cycles performed for each of the resistive random access memory cells reaches a threshold value, the forming operation of each of the resistive random access memory cells is determined as a failure.

12. The forming operation method according to claim 11, wherein the threshold value is between 0.2 and 1 millisecond.

13. The forming operation method according to claim 2, wherein a pulse width of the negative pulse is fixed, and a pulse width of the positive pulse changes in different forming cycles of each of the resistive random access memory cells.

14. The forming operation method according to claim 13, wherein the pulse width of the positive pulse increases as a number of forming cycles executed for each of the resistive random access memory cells increases.

* * * * *